United States Patent [19]

Mizukoshi

[11] Patent Number: 5,297,006
[45] Date of Patent: Mar. 22, 1994

[54] THREE-DIMENSIONAL MULTI-CHIP MODULE

[75] Inventor: Masataka Mizukoshi, Kawasaki, Japan

[73] Assignee: Fujitsu Limited, Kawasaki, Japan

[21] Appl. No.: 916,264

[22] Filed: Jul. 21, 1992

[30] Foreign Application Priority Data

Aug. 13, 1991 [JP] Japan .................. 3-202089

[51] Int. Cl.⁵ ............................. H05K 7/20
[52] U.S. Cl. .................. 361/704; 165/80.3; 257/713; 361/719; 361/764; 439/76
[58] Field of Search .......... 257/706, 712, 713; 174/252, 16, 3; 439/76, 485; 165/80.3, 185; 361/382, 383, 386–389, 395, 401, 412, 413, 704, 707, 709, 715, 719, 718, 761, 764

[56] References Cited

U.S. PATENT DOCUMENTS 4,654,694  3/1987  Val .......................... 357/74
4,703,339  10/1987  Matsuo ...................... 357/81

FOREIGN PATENT DOCUMENTS 0264469  4/1988  European Pat. Off. .
2630859  11/1988  France .

OTHER PUBLICATIONS

IBM Tech Discl Bull vol. 21, No. 3 Aug. 1978, p. 1064, "Ceramic Cup ... Package", Durand et al.
IBM Tech Discl Bull Vol. 21 No. 1 Jun. 1978, p. 183, "Packaging Structure", Blake et al.
IBM Tech Discl Bull Vol. 21 No. 1 Jun. 1978, p. 99, "Circuit Chip ... Bond", Coombs et al.
IBM Tech Discl Bull vol. 21 No. 2 Jul. 1978, p. 585, "High Performance ... Memory", Doo et al.
IBM Technical Disclosure Bulletin, vol. 27, No. 7B, Dec. 1984, New York p. 4226, R. A. Cicone et al. 'Silicon integrated high performance package'.

Primary Examiner—Gerald P. Tolin
Attorney, Agent, or Firm—Staas & Halsey

[57] ABSTRACT

A three-dimensional multi-chip module having high integration density and a high power output. The module includes a substrate having wiring patterns thereon and a plurality of electrode terminals. At least one semiconductor element is arranged facedown on a bottom surface of the substrate and is operatively connected to the electrode terminals. At least one semiconductor element or passive element is arranged on the front surface of the substrate and is operatively connected to the electrode terminals. A heat conductive base is disposed so as to face the bottom surface of the substrate and the base is in thermal contact with the back surface of the semiconductor element arranged on the bottom surface of the substrate. A support base and a cap are provided so that the heat conductive base, the support base and the cap form an enclosure for the substrate.

18 Claims, 3 Drawing Sheets

THREE-DIMENSIONAL MULTI-CHIP MODULE

BACKGROUND OF THE INVENTION

1. Field of the Invention

The present invention relates to a three-dimensional multi-chip module comprising a plurality of semiconductor chips, and more particularly to a multi-chip module having a structure whereby higher integration density and high power output is achieved.

2. Description of the Related Art

The most typical three-dimensional multi-chip module of the prior art is schematically illustrated in FIG. 1. A plurality of semiconductor elements (chips) 10 are arranged on both surfaces of a substrate 2. Wiring patterns and electrode terminals (not shown) are formed in advance on the surfaces of the substrate 2, and bonding pads formed on each semiconductor element 10 are operatively connected to electrode terminals of the wiring patterns by bonding wires 13. The substrate 2 with semiconductor elements 10 thereon is disposed on a stage 11a of a lead frame 11, and electrode terminals of the wiring pattern are operatively connected by bonding wires 15 to inner leads 11b of the lead frame 11. The sub-assembly thus formed is molded in a mold package 18 of epoxy resin.

In order to obtain a higher integration density in a multi-chip module, a wireless bonding method has been utilized. As the wireless bonding method, flip-chip, beam lead and TAB (tape automated bonding) methods are widely known. Among these methods, the flip-chip method is most effective for saving bonding area on the surface of a substrate.

When the multi-chip module includes a semiconductor element which generates a lot of heat during operation, a problem of dissipating such heat from the multi-chip module arises. FIG. 2 shows an example of a multi-chip module of the prior art, in which the multi-chip module comprises two high power output semiconductor elements 10a. The multi-chip module further comprises two semiconductor elements 10b which have comparatively small heat generating characteristics. The semiconductor elements 10a and 10b are all bonded facedown to a substrate 2 using a flip-chip bonding method, wherein, bumps 14 of solder are formed in advance on the major surfaces of the semiconductor elements, and the semiconductor elements are disposed on the substrate 2 so that the bumps are brought into contact with electrode terminals of a wiring pattern (not shown) on the substrate 2 and bonded thereto. The wiring pattern is connected to outer leads 12. The back surfaces of the high power semiconductor elements 10a are held in contact with a heat conductive base 4 using heat conductive paste 16 disposed therebetween. After affixing a heat sink 5 to the above package, the multi-chip module is finally completed.

The package structure of the prior art of FIG. 2 encloses semiconductor elements which are arranged two-dimensionally on a front surface of the substrate 2 only. Therefore, integration density can not be increased to the level of three-dimensional multi-chip modules. Further, there is a problem that mixed attachment of the semiconductor elements is difficult, in which one semiconductor element requires wire bonding and an other semiconductor element requires flip-chip bonding.

SUMMARY OF THE INVENTION

It is an object of the present invention to provide a multi-chip module having a high integration density and a high power output.

It is another object of the present invention to provide a multi-chip module having a higher integration density and a high power output, in which high power semiconductor elements and low power semiconductor elements and/or passive elements are mixed and arranged three-dimensionally on both surfaces of a substrate.

It is still another object of the present invention to provide a three-dimensional multi-chip module which provides for directly removing the heat generated in high power semiconductor elements arranged on one side of a substrate.

It is further object of the present invention to provide a three-dimensional multi-chip module which further provides for indirectly cooling the elements arranged on the other side of the substrate by removing the heat of the substrate.

The above objects are achieved by a three-dimensional multi-chip module of the present invention. The module comprises a substrate having first and second surfaces and wiring patterns having a plurality of electrode terminals disposed respectively on the first and second surfaces. The module further includes at least a first semiconductor element having a front face and a back surface. The first semiconductor element is arranged with its front face on the first surface of the substrate and operatively connected to the electrode terminals on the first surface. The module also includes at least a second semiconductor element or a passive element arranged on the second surface of the substrate and operatively connected to the electrode terminals on the second surface. A heat conductive base is included in the module. Such base has a contact surface which faces the first surface of the substrate and which is in contact with the back surface of the first semiconductor element arranged on the first surface of the substrate.

The multi-chip module of the present invention further comprises a support base and a cap which form an enclosure together with the heat conductive base. A heat sink is fixed to the heat conductive base. Together, these elements achieve high integration density and high module power.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

Figure 1:
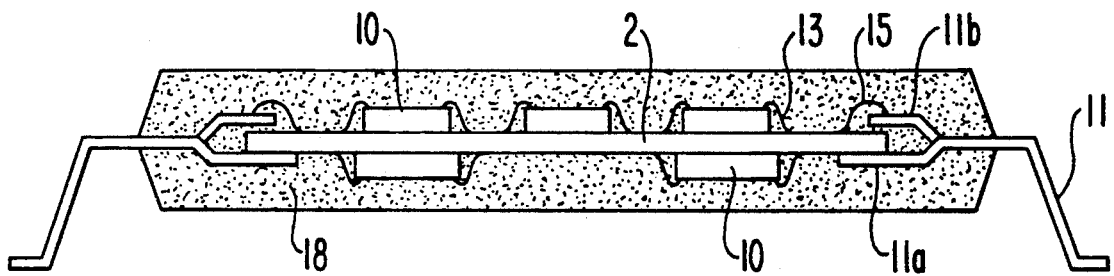
FIG. 1 is a schematic cross sectional view of a multi-chip module of the prior art in which semiconductor elements are arranged on both surfaces of a substrate and packaged in a resin mold.
Figure 2:
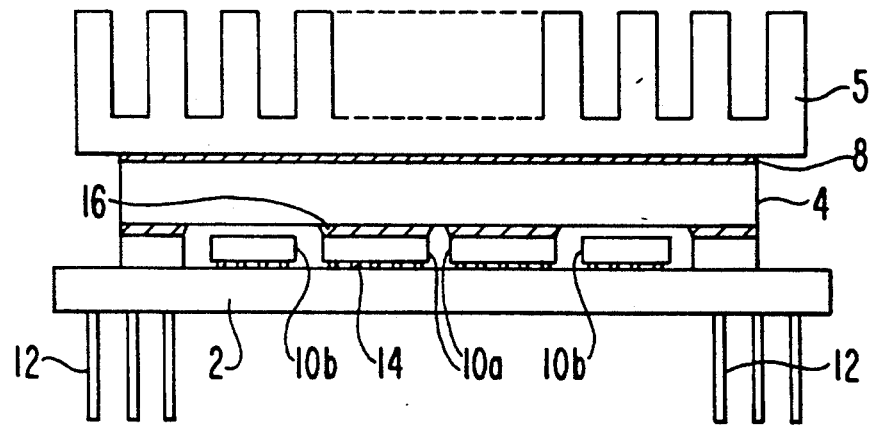
FIG. 2 is a schematic cross sectional view of a multi-chip module of the prior art in which semiconductor elements are arranged on a front surface of a substrate only and a heat sink is provided for cooling high power semiconductor elements.
Figure 3:
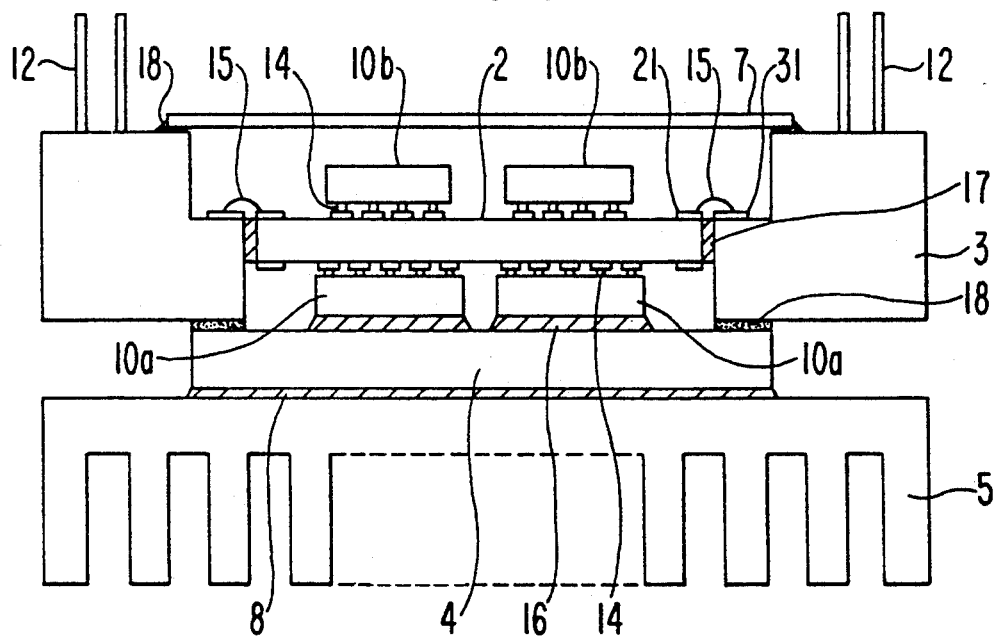
FIG. 3 is a schematic cross sectional view of an embodiment of a three-dimensional multi-chip module of the present invention in which high power and low power semiconductor elements are respectively arranged on both top and bottom surfaces of a substrate, and cooling is provided for the high power semiconductor elements.

FIG. 3 is a schematic cross sectional view of an embodiment of a three-dimensional multi-chip module in accordance with the present invention.

A support base 3, a heat conductive base 4 and a cap 7 form a packaging enclosure for the multi-chip module, and a substrate 2 with semiconductor elements 10a and 10b thereon is enclosed by the enclosure. A heat sink 5 is attached to the heat conductive base 4 and enhances the heat handling capability of the multi-chip module.

The substrate 2 is of a multilayer ceramic construction and predetermined wiring patterns are formed between ceramic layers and/or on the surface of the substrate by known technology. A plurality of semiconductor elements 10a and 10b are arranged on the surfaces of the substrate 2, and as can be seen in FIG. 3, the first (lower) surface of substrate 2 subsequently faces the heat conductive base 4 after packaging. The semiconductor elements 10a which require comparatively large heat dissipation are arranged on the first surface of the substrate 2. The semiconductor elements 10b, which require comparatively small heat dissipation, are arranged on the second (upper) surface of the substrate 2. Semiconductor elements which require dissipation of several watts to tens of watts are preferably arranged on the surface of the substrate 2 which faces the heat conductive base 4.

In FIG. 3, semiconductor elements 10a and 10b are bonded facedown to the first and second surfaces of the substrate 2. In this connection, the major surface comprising the main integrated circuits of the semiconductor element is bonded so as to face the substrate 2. In FIG. 3, a flip-chip method is applied for bonding the semiconductor elements 10a and 10b to substrate 2. And in this case, a plurality of bumps 14 which are to be bonded to electrode terminals of the wiring pattern, are formed in advance on the major surfaces of the semiconductor elements. The semiconductor elements 10a and 10b are disposed at predetermined positions respectively on the first and second surfaces of the substrate 2, and heat is applied for reflowing the solder of the bumps.

A subassembly composed of the semiconductor elements 10a and 10b and the substrate 2 is mounted on another subassembly composed of the support base 3 and the heat conductive base 4. These two subassemblies are then fixed together by thermal conductive resin or solder. The support base 3 has a multilayer ceramic construction and comprises a buried wiring pattern (not shown), a plurality of outer leads 12 and a plurality of electrode terminals 31. The outer leads 12 and electrode terminals 31 are operatively connected by the wiring pattern.

The material used for the heat conductive base 4 must have a high thermal conductivity and must also have a thermal expansion coefficient which is as close to that of silicon as possible. Porous sintered copper-tungsten (Cu-W) and sintered copper-molybdenum (Cu-Mo) have a thermal expansion coefficient of approx. $6 \times 10^{-6}$/deg, and these materials are favorable for use as the heat conductive base 4 on which silicon chips (having a thermal expansion coefficient of about $2.6 \times 10^{-6}$/deg) are disposed.

The substrate 2 with semiconductor elements 10a and 10b thereon is mounted on the heat conductive base 4 in a manner that the minor surfaces (back surfaces) of the semiconductor elements 10a are adjacent to the heat conductive base 4. These back surfaces of the elements 10a are affixed to base 4 using a heat conductive adhesive 16 such as Ag paste, solder, etc. disposed between the thermal conductive base 4 and the minor surfaces of the semiconductor elements 10a. The substrate 2 is affixed to the support base 3 using an insulating thermal conductive resin is disposed therebetween.

Next, electrode terminals 31 on step portions of the support base 3 and electrode terminals 21 on the substrate 2 are connected by bonding wires 15.

Finally, a heat sink 5 of aluminum or an aluminum alloy is affixed on the outer surface of the heat conductive base 4 using a thermal compound, and the cap 7 of an iron-nickel alloy is placed so as to close an opening of the support base 3. Thus, the three-dimensional multichip module of the FIG. 3 is completed.

Figure 4:
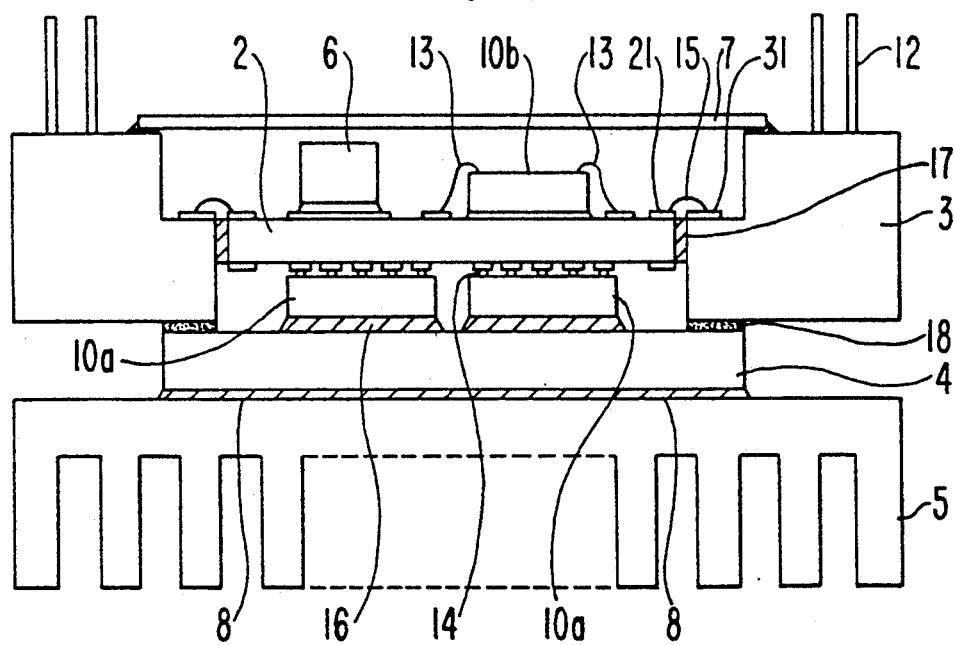
FIG. 4 is a schematic cross sectional view of another embodiment of a three-dimensional multi-chip module of the present invention in which high power semiconductor elements are arranged on the bottom surface and low power semiconductor elements and/or passive elements are arranged on the top surface of a substrate.

FIG. 4 is a schematic cross sectional view of another embodiment of a three-dimensional multi-chip module of the present invention. Semiconductor elements 10a having comparatively large heat dissipation requirements are arranged facedown on the first surface (bottom surface) of the substrate 2 and bonded thereto in the same way as in FIG. 3. On the other hand, semiconductor elements 10b having comparatively small heat dissipation requirements are arranged faceup on the second surface (front surface) of the substrate 2. Pads (not shown) on the semiconductor element 10b are connected to electrode terminals on the substrate 2 using a bonding wire 13. Further passive elements 6 such as capacitors, coils or resistors are arranged on the second surface of the substrate 2 and connected to the electrode terminals on the substrate 2.

FIG. 4 shows that active and/or passive elements which require a wire-bonding method can be mixed and included in the module using the second surface of the substrate 2.

Figure 5:
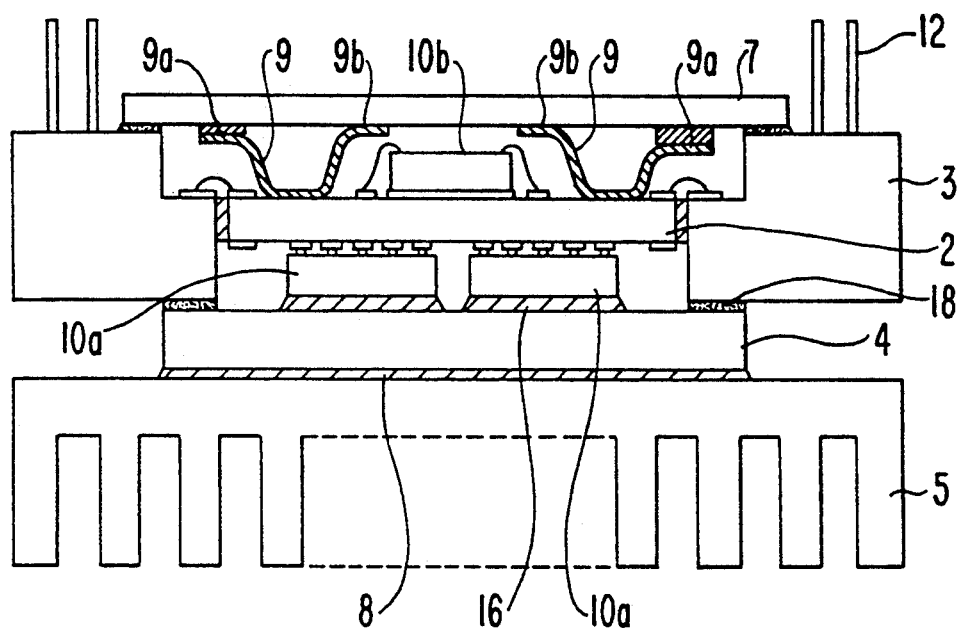
FIG. 5 is a schematic cross sectional view of still another embodiment of a three-dimensional multi-chip module of the present invention in which provision for cooling a substrate is added to the structure of FIG. 4.

FIG. 5 is a schematic cross sectional view of still another embodiment of the present invention. The only difference in structure between FIG. 4 and FIG. 5 is that the module of FIG. 5 further includes a heat conductive metal member 9 having elasticity. One end 9a of the metal member 9 is fixed to an inside surface of the cap 7. The other end 9b of the metal member 9 is elastically in contact with the inside surface of the cap 7 so that it can move when the metal member 9 is subjected to thermal expansion. The middle portion of the metal member 9 is elastically in contact with the second surface of the substrate 2 and presses against the second surface of the substrate 2 when the cap 7 closes the opening of the support base 3.

Since semiconductor elements 10b and/or passive elements 6 arranged on the second surface of the substrate 2 have no direct heat removing means such as the heat conductive base 4 for the semiconductor elements 10a on the first surface of the substrate 2, heat generated in semiconductor elements 10b and passive elements 6 is conducted to the substrate 2. Resultant temperature rise in the substrate 2 can be markedly reduced by the function of the metal members 9 which conduct the heat of the substrate 2 to the cap 7 which is cooled by the ambient atmosphere.

The shape of the metal member 9 shown in FIG. 5 is illustrative only, and many other shapes can be used. One end of the metal member 9 may be fixed to the substrate 2 and the other end may be in contact with the cap 7 or vice versa. A metal member 9 having a "U" shape may be used lying on its side.

Figure 6:
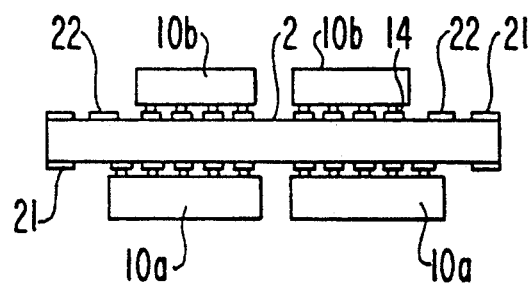
FIG. 6 is a schematic side view of a subassembly of the present invention including a substrate and semiconductor elements, wherein the subassembly may be subjected to a preliminary test before it is packaged.

FIG. 6 is a schematic cross sectional view of a modified structure of a substrate 2 with semiconductor elements 10a and 10b arranged thereon. The wiring patterns (not shown) on the substrate 2 include test terminals 22 other than the electrode terminals 21 which are actually used for bonding the semiconductor elements 10a and 10b and subsequently for connecting the wiring patterns to the outside electrode terminals. Before packaging the substrate 2 having the semiconductor elements 10a and 10b bonded thereto into the multi-chip module, it is desirable that the subassembly of FIG. 6, comprising the substrate 2, with the semiconductor elements 10a and 10b bonded thereto, be subjected to a function test, in which the entire circuit of the module is divided into several circuit blocks and each circuit block is tested using the test terminals 22 and/or electrode terminals 21.

When any of the circuit blocks is found to be defective, a defective semiconductor element can be easily replaced with a good one. After confirming that the operation of the subassembly is satisfactory, the substrate 2 with semiconductor elements 10a and 10b thereon is packaged in the enclosure of support base 3, heat conductive base 4 and cap 7. In FIG. 6, all semiconductor elements 10a and 10b are bonded facedown to the substrate 2 using bumps 14. A substrate 2 having test terminals 22 can also be utilized for other multi-chip modules comprising semiconductor elements requiring wire bonding and/or passive elements.

What is claimed is:

1. A multi-chip module having a plurality of semiconductor elements arranged three-dimensionally, said module comprising:
   a substrate having first and second surfaces and including wiring patterns providing a respective plurality of electrode terminals on each of said surfaces;
   a first semiconductor element having a front face and a back surface, said first element being mounted on the substrate with its front face on said first surface of the substrate and being operatively connected to electrode terminals on said first surface;
   a second semiconductor element mounted on the second surface of the substrate, said second element being operatively connected to electrode terminals on said second surface;
   a heat conductive base having a contact surface which faces the first surface of the substrate, said contact surface being in thermal contact with the back surface of said first element;
   a support base having a plurality of outer leads and a plurality of electrode terminals operatively connected to the outer leads, said base having an opening therein, said substrate with the semiconductor elements thereon being disposed in said opening, said electrode terminals on the support base being operatively connected to said electrode terminals on the substrate, said support base being affixed to said heat conductive base;
   a cap disposed on said support base so as to face the second surface of the substrate, said heat conductive base, said support base and said cap forming an enclosure for said substrate; and
   an elastic member of heat conductive material disposed between the inside surface of said cap and the second surface of the substrate, said member being positioned and arranged for conducting heat generated by elements on said second surface of the substrate to said cap.

2. A multi-chip module as recited in claim 1, wherein said elastic member is an elongated metal strip having one fixed end and one slidable end which is free to move when the member thermally expands.

3. A multi-chip module as recited in claim 2, wherein said fixed end is fixed to said inside surface and the slidable end is in slidable contact with said inside surface.

4. A multi-chip module as recited in claim 3, wherein said strip has a middle portion which is in contact with said second surface.

5. A multi-chip module having a plurality of semiconductor elements arranged three-dimensionally, said module comprising:
   a substrate having first and second surfaces and including wiring patterns providing a respective plurality of electrode terminals on each of said surfaces;
   a first semiconductor element having a front face and a back surface, said first element being mounted on the substrate with its front face on said first surface of the substrate and being operatively connected to electrode terminals on said first surface;
   a second semiconductor element mounted on the second surface of the substrate, said second element being operatively connected to electrode terminals on said second surface;
   a heat conductive base having a contact surface which faces the first surface of the substrate, said contact surface being in thermal contact with the back surface of said first element;
   a support base having a plurality of outer leads and a plurality of electrode terminals operatively connected to the outer leads, said base having an opening therein, said substrate with the semiconductor elements thereon being disposed in said opening, said electrode terminals on the support base being operatively connected to said electrode terminals on the substrate, said support base being affixed to said heat conductive base, and said support base being in thermal contact with said substrate and said heat conductive base.

6. A multi-chip module having a plurality of semiconductor elements arranged three-dimensionally, said module comprising:
   a substrate having first and second surfaces and including wiring patterns providing a respective plurality of electrode terminals on each of said surfaces;
   a first semiconductor element having a front face and a back surface, said first element being mounted on the substrate with its front face on said first surface of the substrate and being operatively connected to electrode terminals on said first surface;

a second semiconductor element mounted on the second surface of the substrate, said second element being operatively connected to electrode terminals on said second surface;

a heat conductive base having a contact surface which faces the first surface of the substrate, said contact surface being in thermal contact with the back surface of said first element, said second element being in thermal contact with only said substrate.

7. A multi-chip module as recited in claim 6, said multi-chip module further comprising:

a support base having a plurality of outer leads and a plurality of electrode terminals operatively connected to the outer leads, said base having an opening therein, said substrate with the semiconductor elements thereon being disposed in said opening, said electrode terminals on the support base being operatively connected to said electrode terminals on the substrate, said support base being affixed to said heat conductive base.

8. A multi-chip module as recited in claim 7, said multi-chip module further comprising:

a cap disposed on said support base so as to face the second surface of the substrate, said heat conductive base, said support base and said cap forming an enclosure for said substrate.

9. A multi-chip module as recited in claim 8, said multi-chip module further comprising:

a heat sink for cooling said heat conductive base.

10. A multi-chip module as recited in claim 6, wherein said first semiconductor element is one whose heat dissipation requirements are relatively large, and said second element is one whose heat dissipation requirements are relatively small.

11. A multi-chip module as recited in claim 6, wherein said second element is a passive element.

12. A multi-chip module as recited in claim 6, wherein the material of said heat conductive base has a thermal expansion coefficient which approximates that of the semiconductor element.

13. A multi-chip module as recited in claim 7, wherein said substrate and said support base are made of ceramic.

14. A multi-chip module as recited in claim 8, said multi-chip module further comprising:

an elongated elastic metal member of a heat conductive material inserted between the second surface of said substrate and an inside surface of said cap.

15. A multi-chip module as recited in claim 14, wherein one end of said metal member is fixed to the inside surface of the cap, the other end thereof is in movable contact with the inside surface of the cap, and a middle portion thereof is in contact with said second surface of the substrate.

16. A multi-chip module as recited in claim 6, wherein said wiring patterns further comprise test terminals used for testing each circuit block of a subassembly composed of said semiconductor elements and the substrate before packaging into the multi-chip module.

17. A multi-chip module as recited in claim 6, wherein said second element is a semiconductor element.

18. A multi-chip module as recited in claim 17, wherein said module includes a passive element on the second surface of the substrate.

* * * * *

UNITED STATES PATENT AND TRADEMARK OFFICE
CERTIFICATE OF CORRECTION

PATENT NO. : 5,297,006
DATED : March 22, 1994
INVENTOR(S) : MASATAKA MIZUKOSHI

It is certified that error appears in the above-indentified patent and that said Letters Patent is hereby corrected as shown below:

Column 1, line 47, after "wherein" delete --,--.

Column 2, line 18, after "is" insert --a--;

line 39, after "is" insert --thermally--;

line 65, delete "," and substitute --;--.

Column 3, lines 27 and 28, after "construction" insert --,--.

Column 4, line 15, after "manner" insert --such--.

Signed and Sealed this

Sixteenth Day of August, 1994

BRUCE LEHMAN

Attest:

Attesting Officer

Commissioner of Patents and Trademarks